(12) United States Patent
Sutherland et al.

(10) Patent No.: US 6,629,301 B1
(45) Date of Patent: Sep. 30, 2003

(54) DETERMINING TRANSISTOR WIDTHS USING THE THEORY OF LOGICAL EFFORT

(75) Inventors: Ivan Sutherland, Santa Monica, CA (US); Josephus Ebergen, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 481 days.

(21) Appl. No.: 09/663,456

(22) Filed: Sep. 15, 2000

(51) Int. Cl.⁷ .............................................. G06F 17/50
(52) U.S. Cl. .............................................. 716/8; 716/1
(58) Field of Search ........................................ 716/1–14

(56) References Cited

U.S. PATENT DOCUMENTS

| | | | |
|---|---|---|---|
| 4,827,428 A | 5/1989 | Dunlop et al. | 364/491 |
| 4,907,180 A | 3/1990 | Smith | 364/578 |
| 6,074,429 A | 6/2000 | Pullela et al. | 716/6 |

OTHER PUBLICATIONS

Mayaram et al., "Analysis of MOS transformer–coupled oscillators", Dec. 1987, IEEE Journal of Solid–State Circuits, vol. 22, pp. 1155–1162.*

Venkat, "Generalized delay optimization of resistive interconnections through an extension of logical effort", May 1993, IEEE International Symposium on Circuits and Systems, vol. 3, pp. 2106–2109.*

Rezvani et al., "LEOPARD: a Logical Effort–based fanout OPtimizer for ARea and Delay", Nov. 1999, IEEE/ACM International Conference on Computer–Aided Design, Digest of Technical Papers, pp. 516–519.*

*Book*, entitled, "Logical Effort: Designing Fast CMOS Circuits" by Ivan Sutherland, Bob Sproull, and David Harris; Morgan Kaufmann Publishers, Inc., San Francisco, CA, 1999, pp. 1–239.

*Logical Effort: Designing Fast CMOS Circuits*, Sutherland, et al, 1999, Morgan Kaufmann Publishers, San Francisco, CA.

* cited by examiner

*Primary Examiner*—Vuthe Siek
*Assistant Examiner*—Sun James Lin
(74) *Attorney, Agent, or Firm*—Park, Vaughan & Fleming LLP (57) ABSTRACT

An apparatus and method for finding suitable transistor sizes for complex logic networks. An electrical "logical effort model" of a logic circuit is made by replacing each logic element with a simple electrical model and retaining the wiring topology of the original circuit. The logical effort model is a DC circuit with parameters that depending only on the gain chosen for the logic elements in the critical path, the stray capacitance of critical connections, and the logical effort of each logic element. A circuit simulation of the logical effort model produces voltages proportional to desired transistor widths. In working on the electrical model, the circuit simulator merely solves the set of simultaneous equations implied by the model. Alternate methods are also described.

36 Claims, 7 Drawing Sheets

DETERMINING TRANSISTOR WIDTHS USING THE THEORY OF LOGICAL EFFORT

CROSS-REFERENCE TO RELATED APPLICATIONS

Not Applicable.

STATEMENT REGARDING FEDERALLY SPONSORSHIP RESEARCH OR DEVELOPMENT

Not Applicable.

BACKGROUND OF THE INVENTION

1. Field of the Invention

The present invention relates to designing integrated circuits. More particularly, the present invention relates to determining transistor widths in integrated circuits.

2. Description of the Related Art

Integrated circuit (IC) design consists of a number of steps designed to aid in the complex task of design and verification. Typically, the design starts with a specification of the functional and performance characteristics of the IC. The IC is typically broken down into smaller units of the whole for design and testing.

Designers may write descriptions of the IC's smaller units, or blocks, which are usable by various types of simulators. The blocks may be used to create a floor plan of the IC which shows the relative placement of the blocks. From the floor plan and descriptions, the designer finishes the circuit design. After the circuit design is finished, the layout of the circuit begins.

One of the areas of greatest effort for a designer is laying out the circuit in such a way as to meet timing constraints. Without a systematic approach, designers resort to continually simulating and modifying the design to achieve the timing constraints.

One way to assist designers in meeting the timing criteria is provided by a method of logical effort. The logical effort model is based on modeling the delay through a single logic element composed of metal-oxide-semiconductor (MOS) gate transistors. The model describes the delays caused by the capacitive load that the logic element drives and the topology of the logic element. As the load on a particular logic element increases, the delay of a signal through the logic element increases. However, the delay also depends on the topology of the logic element itself. For example, a typical transistor implementation of an inverter consists of an input going to the gates of two transistors, one n-type and one p-type. The drains of each transistor are connected together for the output and the sources are connected to power (the p-type) and ground (the n-type). In more complex logic elements, additional transistors may be connected in series or in parallel to power and ground. Transistors connected in series are less effective in driving a load as compared to similar transistors connected in parallel driving a similar load.

Delay through a logic element is composed of two components, a fixed parasitic delay and a stage effort delay. The stage effort delay, or effort delay, depends on the load on the logic element's output and the particular size and topology of the gate. We can describe these two effects as the logical effort, which captures topological properties of the logic element, and the electrical effort, which characterizes the relative size of the load with respect to the width of the transistors in the logic element. The effort delay of a logic element comes from the product of the logical effort and the electrical effort.

The logical effort is independent of the width of the transistors in the circuit, while the electrical effort is the ratio of the load driven to the size of the transistors in the logic element. The electrical effort is defined as the capacitance that loads the output of the logic element divided by the capacitance presented by the input terminal of the logic element.

Logical effort is defined so that an inverter has a logical effort of one. Moreover, an inverter driving a copy of itself will have an electrical effort of one because the input and driven capacitance are equal. Accordingly, the effort delay through an inverter is 1. In general, the logical effort of a logic element describes how much worse it is at driving an output load than an inverter with the same capacitance presented at its inputs. Accordingly, the logical effort model illustrates how much more slowly it will drive a load than would an inverter. Another way to think of the logical effort is how much more input capacitance a logic element must present to deliver the same output current as an inverter.

The logical effort model is described more completely in Logical Effort: Designing Fast CMOS Circuits, by Ivan Sutherland, Bob Sproull, and David Harris, Morgan Kaufman Publishers, Inc. IBSN # 1-55860-557-6. This model is helpful to designers looking for speed by adjusting the stage efforts. It provides transistor sizes but only through laborious calculations.

BRIEF SUMMARY OF THE INVENTION

The present invention provides a system and method for determining widths of transistors. After a circuit description including logic elements is created, each logic element is replaced with an associated sizing element to create a sizing model which retains the same wiring topology as the original circuit. The solution to the sizing model provides the transistor widths for the logic elements. The sizing model depends on a step-up value and a logical effort value for each input of each logic element. The calculations on the sizing model may be accomplished by analog circuit simulation methods, Gaussian elimination methods, or approximation methods.

According to the invention, the sizing element used for each logic element delivers current at each logic element input and receives current at each logic element output. Thus, the logic element input becomes a current source in the sizing element and the logic element output becomes a current sink in the sizing element. The input of the logic element in the sizing element becomes a current source providing an indication of how much current would be required to drive the logic element input. Furthermore, the current delivered by this source is proportional to current values received at the sizing element sink.

In one aspect of the invention each output of the logic element is replaced with a device that accepts a current. The device may be a resistor or tunable resistor. In another aspect, the resistor has a resistance equal to an inverse of the step-up value. The voltage appearing across the resistor determines the logic element sizing. The current received at the sizing element sink is the sum of all of the currents from source terminals of the sizing elements of other logic elements connected to the particular sizing element. The received current is indicative of the total load driven by the logic element output.

The current delivered by the sizing element source at the circuit element's input is proportional to a logical effort of that input of the circuit element. In another aspect the input of the circuit element is replaced with a sizing element that produces a current proportional to a required charge of the input of the circuit element. The required charge is proportional to a size of the capacitance presented by the input to the circuit element.

In still another aspect of the invention, the sizing element output includes a current generating device adapted to generate a current equal to a logical effort value multiplied by the voltage appearing at the current sinking device. The logical effort value can be input by various means or be fixed.

In yet another aspect, the current produced by the sizing element is equal to the current appearing at the sizing element input multiplied by the logical effort of the input to the circuit element, that result divided by the step-up for the circuit element.

In another aspect of the invention, a system is provided whereby a plurality of sizing elements, each corresponding to a particular logic element, replaces its logic circuit element. The circuit elements have inputs and an output which are replaced by sources and drains, respectively, of the module primitives. A support is provided upon which to place the module primitives. Connectors are provided for connecting module primitives on the support.

In one aspect, each module primitive has a current source connected to the module primitive output, the output of the current source being proportional to a logical effort of the logic element input.

If the circuit element has an output, then the output is replaced by a module primitive drain corresponding to the circuit element output and a resistor connected between the module primitive drain terminal and ground. The resistor may be tunable.

In another aspect, the module primitive further includes a logical effort input adapted to receive a value of the logical effort for each input. In still another aspect of the invention, the circuit primitive has a step-up value that may be fixed or variable.

The system also includes an indicator adapted to indicate the circuit element size.

In another aspect of the invention, a method is provided for determining a logic element's size by computing the driven load incurred by the driving logic element and dividing the driven load by a step-up value to determine the driving logic element size. For each driven logic element that the driving logic element drives, a respective logic element load is calculated and summed to determine the driven load. To calculate the respective logic element load, a driven logic element's size is multiplied by the logical effort of the driven input of the logic element.

In one aspect the resultant size is the larger of a minimum circuit element size and the result of calculating the driving logic element size.

In another aspect of the invention a method of computing logic element sizes is provided that computes for each driving logic element in a circuit design, a respective driven load incurred by each driving logic element based on a respective step-up value and then dividing the respective driven load by the respective step-up value to determine the respective logic element size. The respective driven load is determined by calculating, for each driven logic element, a respective logic element load and summing, for each driven logic element, the respective logic element loads to determine the respective driven load. The respective logic element load is calculated by multiplying a driven logic element's size by a logical effort of the driven input of the logic element.

In another aspect of the invention the logic element size is the larger of a minimum logic element size and the result of the dividing step for each driving logic element.

BRIEF DESCRIPTION OF THE DRAWINGS

The accompanying drawings, which are incorporated in and constitute a part of this specification, illustrate at least one embodiment of the invention and, together with the description, serve to explain the principles and advantages of the invention. In the drawings.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments illustrated, but is to be accorded the widest possible scope consistent with the principles.

Reference will now be made in detail to implementations consistent with the principles of the present invention as illustrated in the accompanying drawings. Wherever possible, the same reference numbers will be used throughout the drawings and the following description to refer to the same or like parts.

Consistent with the principles of the present invention a method and apparatus are provided that assists circuit designers in finding logic element sizes that speed up a circuit design. Finding the sizes comes from the realization that a logic element may be modeled by a sizing element wherein the inputs of the logic element become current sources of the sizing element and the logic element output becomes a current sink of the sizing element. Each source output of the sizing element, which corresponds to one of the logic element inputs, produces a current proportional to a current appearing at the sink input of the sizing element. The proportionality is related to the logical effort that the respective logic element input incurs and the desired step-up of the logic element. One way to achieve this is to model the output of the logic element (i.e., the sink input of the sizing element) with a resistor to ground. If the resistor has a selected resistance related to the step-up, then the voltage appearing across the resistor can be multiplied by the logical effort of one of the logic element inputs to obtain the current output by the sizing element for that input to the logic element.

Figure 1:
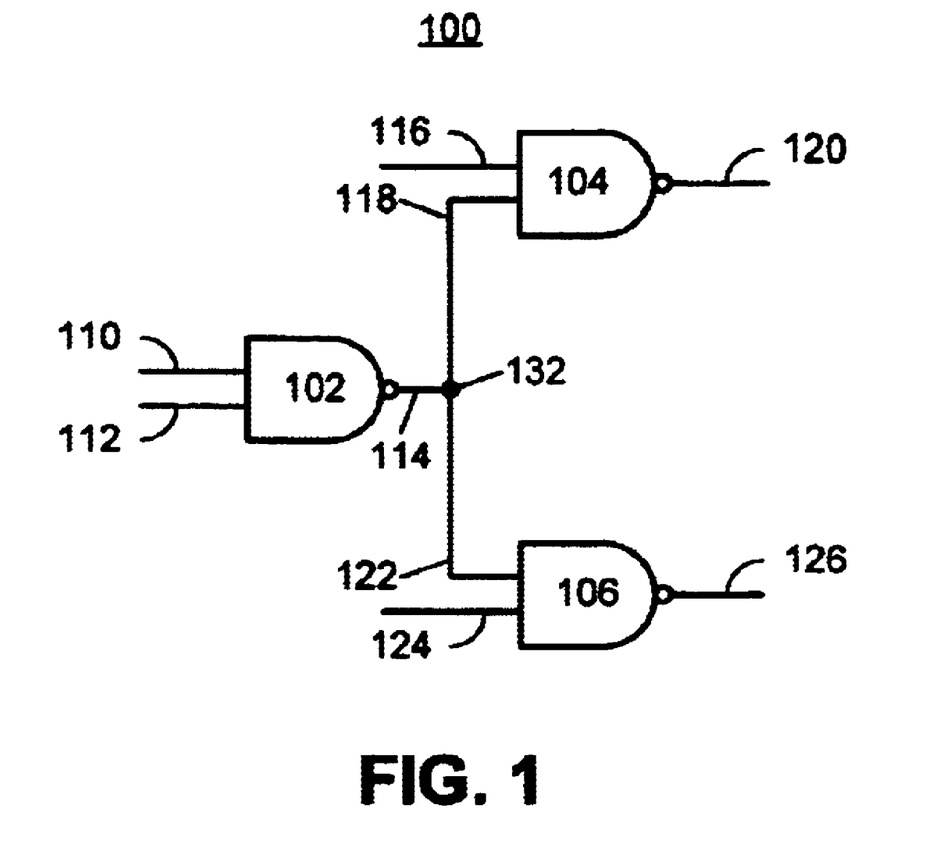
FIG. 1 is an illustration of a simple gate level circuit.

In order to understand the principles of the invention, FIG. 1 illustrates several NAND logic elements in a simple circuit design 100. A NAND logic element produces a logic value of "0" if and only if both inputs are of logic "1". The simple circuit design 100 includes NAND logic elements 102, 104, and 106. Logic element 102 has inputs 110 and 112 and output 114, logic element 104 has inputs 116 and 118 and output 120, and logic element 106 has inputs 122 and 124 and output 126. The output 114 of logic element 102 is connected to the input 118 of logic element 104 and to input 122 of logic element 106.

Figure 2:
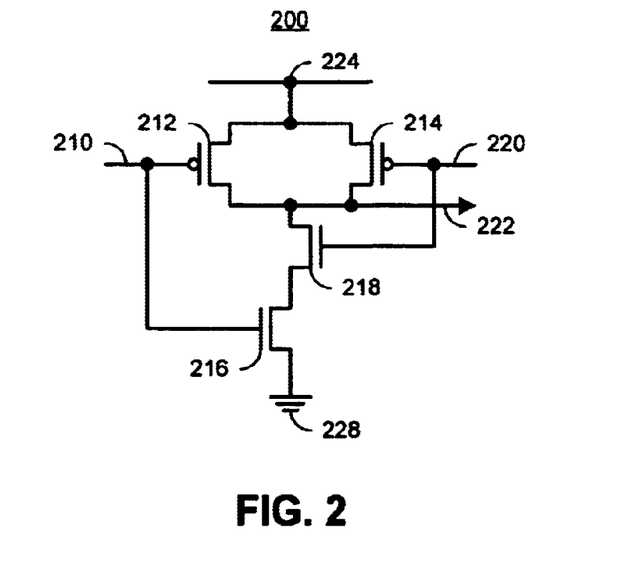
FIG. 2 is an illustration of a transistor level circuit for one of the gates in FIG. 1.

FIG. 2 illustrates a transistor circuit element 200 of the logic element 102 in FIG. 1. The transistor circuit element 200 includes input 200, p-type transistors 212 and 214, n-type transistors 206 and 218, input 220, output 222, power 224, and ground 228.

Input 210 corresponds to the logic element input 110, and connects to the gates of p-type transistor 212 and n-type transistor 216. When the logic value appearing at the input 210 is a logic value of "1" then transistor 212 is non-conductive and transistor 216 is conductive. When the logic value appearing at the input 210 is a logic value of "0" then transistor 212 is conductive and transistor 216 is non-conductive. In a similar fashion, when the logic value appearing at the input 220 is a logic value of "1" then transistor 214 is non-conductive and transistor 218 is conductive and when the logic value appearing at the input 220 is a logic value of "0" then transistor 214 is conductive and transistor 218 is non-conductive. When either or both of transistors 212 and 214 are conductive, the output 222 will be electrically connected to power 224 and its logic value will be "1" . However, when both of the transistors 216 and 218 are conductive, they make a series electrical connection between output 222 and ground such that the output 222 is a logic "0".

The time from when one of the inputs 210 or 220 changes until the result appears at the output 222 depends on the capacitive load that the logic element 102 drives, the topology of the logic element 102 as illustrated by circuit element 200, and the size of the transistors comprising the logical effort. As the capacitive load on the output, 222 increases, the delay through logic element 102 increases, because the same transistors 212, 214, 216, and 208 can deliver only a finite amount of current and so take longer to charge a larger capacitive load. It takes more time to pass the additional charge. The delay is also affected by the circuit topology as well. It is more difficult to generate current through transistors in series than it is if they were in parallel.

Each transistor in circuit 200 has a respective gate size. Typically a transistor gate length is a factor of the fabrication process and the width is varied depending on the amount of current needed at the output. The size parameter determined by method and apparatuses consistent with the present invention represents an amount to scale the transistors widths selected for a particular type of logic element such as the NAND logic element 200.

Figure 3:
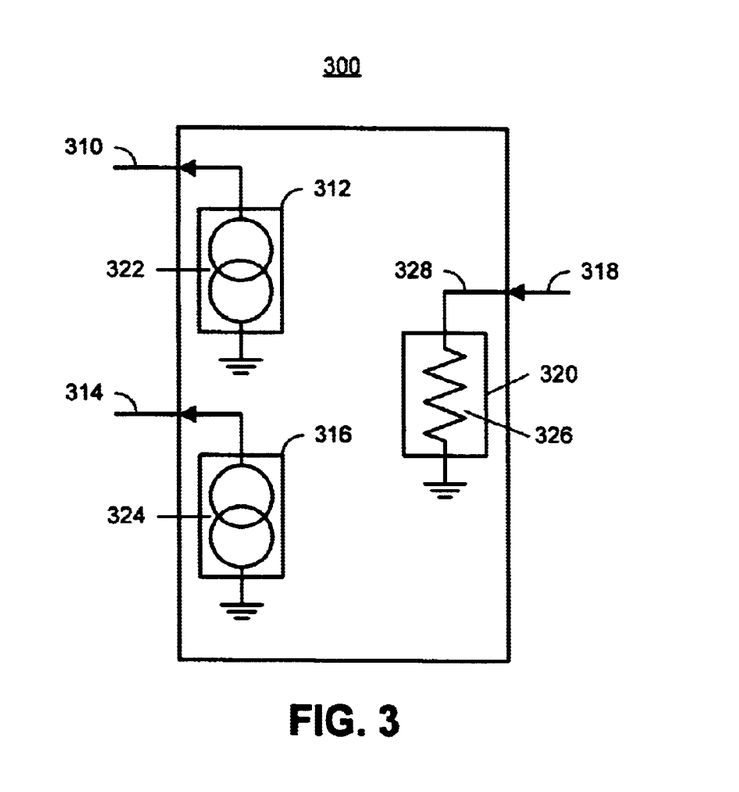
FIG. 3 is a sizing element according to the present invention for one of the gates in FIG. 1.

FIG. 3 illustrates a sizing element 300 according to principles consistent with the present invention for the NAND logic element 102 in FIG. 1 and its associated circuit 200 in FIG. 2. The sizing element 300 includes a source terminal 310, a source element 312, a source terminal 314, a source element 316, a sink terminal 318, and a sink element 320. The source element 312 is connected between source terminal 310 and ground, the source element 316 is connected between source terminal 314 and ground, and the sink element 320 is connected between sink terminal 318 and ground. In FIG. 3, source element 312 is illustrated as a current source 322, source element 316 is illustrated as a current source 324, and sink element 318 is illustrated as a resistor 326.

As can be seen from FIGS. 1 and 3, the inputs 110 and 112 of the NAND logic element 102 become current source terminals 310 and 314 in the sizing element 300. In the sizing element 300, current represents the charge required for one complete transition in the logic element 102. The sizing element 300 delivers a DC current at each of its source terminals 310 and 314, corresponding to the logic element's input terminals 110 and 112, proportional to the amount of charge that the logic element 102 will demand on that logic element input terminal. Of course, this current is also proportional to the input capacitance of the logic element 102 as would be determined by examining the transistor gate widths on transistors 212, 214, 216, and 218. For example, the input capacitance seen by input 110 (corresponding to input 210 in FIG. 2) is affected by the size of transistors 212 and 216, whereas input 112 (corresponding to input 220 in FIG. 2) is affected by the size of transistors 214 and 218. A similar sizing element would be applied when replacing logic elements 104 and 106, but the current may differ depending on the characteristics of load and transistor size just described.

These sizing element currents sum in each sizing element wire just as the capacitive loads on the circuit wire do. For example, the sizing elements replacing logic elements 104 and 106 would each generate a current on the wire 132 connecting logic element inputs 118 and 122 (and thus sizing element outputs) to the sink terminal 318 of the sizing element 300 replacing logic element 102. The currents in the sizing element 300 return to ground through the resistor 326 in the associated sizing element 300. The current through the resistor 326 is therefore proportional to the total charge that will be absorbed each time the wire 132 associated with the output 114 of logic element 102 changes state. This current indicates, in effect, how hard it is to drive that wire 132.

A stage gain establishes the gain each logic element delivers during its anticipated time of operation. For example, for a charge Q appearing at an input to an element having a gain of g, a charge g*Q will appear at the output in the corresponding operation time. The stage gain is selected to obtain a particular stage operation time and stage delay. The greater the gain expected of the circuit, the slower the circuit will switch a given load.

One way to represent the stage gain in the sizing element 300 is to make the resistor 326 have value 1/g ohms, where g is the gain or the step-up value. Thus a voltage, V, across the resistor 326 measured at a point 328, is smaller for a high gain stage than for a low gain stage given similar loads. The current sources in sizing element 300 are proportional to this voltage, adjusted for the logical effort of each input. For example, in sizing element 300, the current output by current source 312 is the logical effort of the input 110 (modeled as source terminal 310) multiplied by the voltage appearing at point 328. Similarly, the current output by current source 314 is the logical effort of input 112 (modeled as source terminal 314) multiplied by the voltage appearing at point 328.

This sizing element works only if a single logic element drives each node. If multiple logic elements drive a single node, for example in a multiplexer, its model resistors will be connected in parallel. In this case we would multiply each resistor value by the number so connected, or omit all but one resistor from the model.

A logic circuit composed only of logic elements modeled in this way has a trivial steady state solution: zero current and zero voltage everywhere. This says that in the absence of stray capacitance or fixed loads, the transistors in logic elements can all in theory be vanishingly small, because none of them need drive any load. Fixed loads and stray capacitance values are modeled as fixed current sources. Consider the ring oscillator 400 illustrated in FIG. 4 including inverter logic elements 410, 412, and 414 connected in a series loop. A fixed capacitive load 416 is connected to the output 418 of inverter 414.

Figure 4:
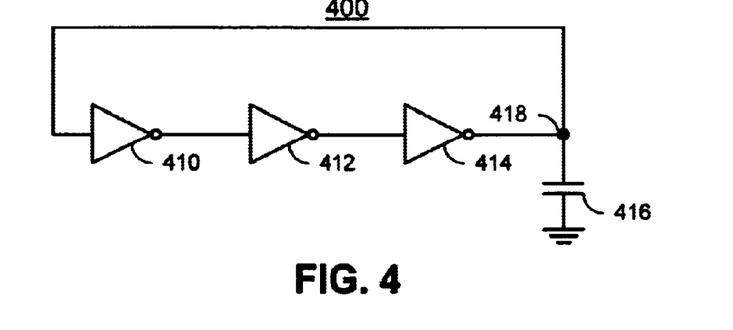
FIG. 4 is a gate level circuit for a ring oscillator.
Figure 5:
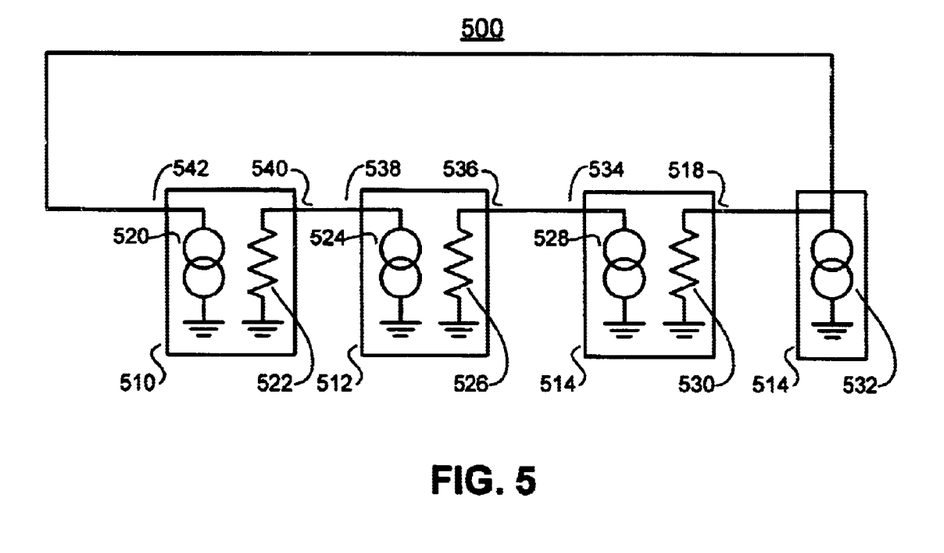
FIG. 5 is a sizing model for the ring oscillator of FIG. 4.

A sizing model 500 for ring oscillator 400 is illustrated in FIG. 5. It includes corresponding sizing elements 510, 512, and 514 for inverter logic elements 410, 412, and 414 respectively. A sizing element 516 modeling the fixed load 416 is connected to the node 518. The sizing element 510 includes a current source 520 and a resistor 522, the sizing element 512 includes a current source 524 and a resistor 526, and the sizing element 514 includes a current source 528 and a resistor 530. The sizing element 516 includes a current source 532. Other models are possible, e.g., a hydraulic model, such that it retains a "summing" property at a single node like sink terminal 518.

Without fixed load 416 (and thus the associated sizing element 516), the logical effort model will show no voltage or current anywhere. However, the output 418 of inverter 414 may drive a fixed load 416, which might be modeling a stray capacitance for example. Including in the sizing model 500 the current source 532 modeling the load causes a voltage to appear at the sink terminal 518 of sizing element 514. This voltage will, in turn, produce a current at a source terminal 534 of sizing element 514. This will produce a voltage at a sink terminal 536 of the sizing element 512, and a smaller current at a source terminal 538 of the sizing element 512. This will, in turn, produce a voltage at a sink terminal 540 of sizing element 510, and an even smaller current at the source terminal 542 of sizing element 510.

The smaller current at the source terminal 542 output from sizing element 510 adds to the fixed current from the current source 532 modeling the load 416. After suitable adjustments, which may require multiple adjustments around the loop. the sizing model 500 may rapidly converge on a stable set of voltages and currents (a steady state). Notice that approximating the solution of equations of the sizing model 500 proceeds around the oscillator ring 400 in a direction opposite to the direction of logic flow.

The resulting voltages and currents in the sizing model indicate suitable sizes for the transistors in logic elements 410, 412, and 414. Logic element 410 can have narrow transistors, logic element 412 can have medium width transistors, and logic element 414 will have transistors large enough to drive the combination of fixed load 416 and the small load of source terminal 410.

The actual transistor gate widths are determined by multiplying the value of the voltage appearing across the resistor in the sizing element by whatever is the basic transistor width in the logic element. The values of the logical effort and step-up ratio are based on unit-less normalized values and can thus be used as a scaling factor for a given set of transistor gate widths in a circuit. That is, the logical effort describes how much worse at driving a load a logic element is as compared to a unit-normal inverter, and the step-up value represents the ratio of output to input load desired for each logic element. In one model, the size is the width of the n-type transistor gate of an inverter with a fixed p-type to n-type ratio and a drive capability equivalent to the drive capability of the gate.

Certain fabrication technologies limit the minimum width that a transistor may have. Minimum width transistors are taken into account by setting out that every sizing element should produce a minimum current at its source terminal corresponding to the capacitance of the narrowest possible transistors. This current should increase only when the load driven by the logic element is sufficiently large to require larger transistors. A circuit simulator, such as SPICE, easily accommodates such a nonlinear relationship between voltage and current.

In ring oscillator 400, for very large stage gain, inverter logic element 414 might be able to drive the fixed load 416 even with minimum width transistors. For somewhat less stage gain, the inverter logic element 414 will need transistors wider than minimum, because minimum transistor sizes will not be enough to drive the load 416, but inverter logic elements 410 and 412 might still use minimum width transistors.

For less stage gain yet, only inverter logic element 410 might have minimum width transistors. For stage gain only slightly above one, all three will need transistors wider than minimum. Further reductions in stage gain will force all transistors to be wider to reduce the resultant effect of the fixed load 416 with respect to the load of inverter logic element 410's inputs. If the circuit element inputs have logical effort greater than one, a certain minimum stage gain would be required to obtain any solution to the equations for any transistor widths. The sizing element 500 voltages and currents would become infinite for stage gains too small to support both the logical effort and the fixed load 416.

Including minimum width transistors may reduce the time taken to simulate the sizing element 500. This is because below the minimum width, adjustments at the output of a logic element change nothing at its input. One might also limit the model logic elements to a maximum practical width. Hitting such an upper limit would indicate that the chosen stage gain, g, is too small to support the fixed loads in the circuit.

The generalized sizing element, of course, presumes an established stage gain in advance. Multiple solutions of the model are possible, of course, for different values of stage gain. As stage gain becomes larger, the circuit as a whole is better able to drive the fixed capacitive loads it faces. This will result in narrower transistors, on the whole, and more minimum width transistors in particular but will result in slower operation.

Figure 6:
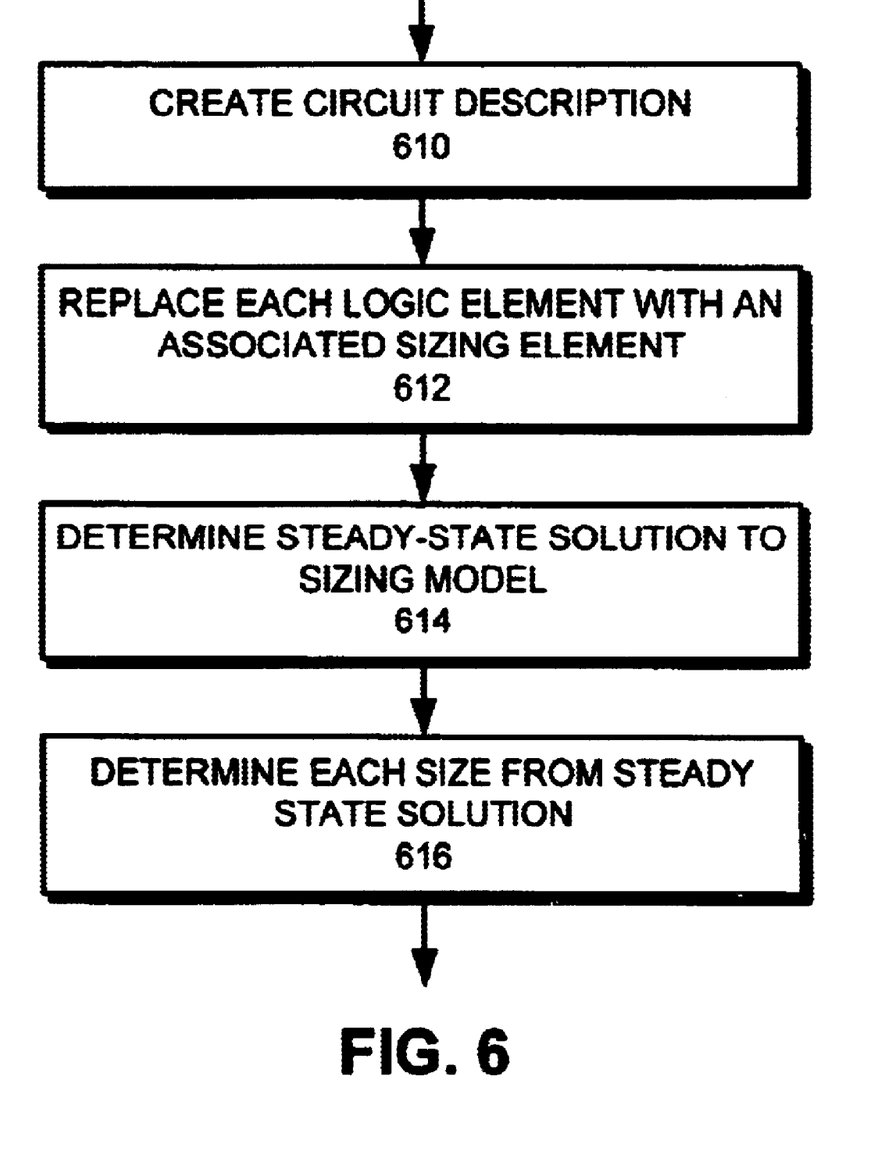
FIG. 6 is a flow chart of the present invention.

FIG. 6 illustrates a method consistent with the present invention. A circuit designer creates a circuit description (step 610) using various design techniques and tools well known. The circuit may be described using various schematic capture tools like "Electric" or commercial tools such as those produced from Cadence Design Systems, Inc. Alternatively, the circuit description can be created by various automatic circuit tools based on a functional requirement. The circuit description details the various logic elements in a design and how they are connected. Each logic element in the circuit description is replaced by its associated sizing element (step 612) to create a sizing model. This may be done by the circuit designer, or an automated tool, or any combination thereof. A steady state solution to the sizing model is found (step 614) and the logic element size is determined from the solution (step 616). In the absence of convergence of the steady state solution, the circuit designer can change some parameters like stage gain g, after which the procedure from step 612 is repeated.

Figure 7:
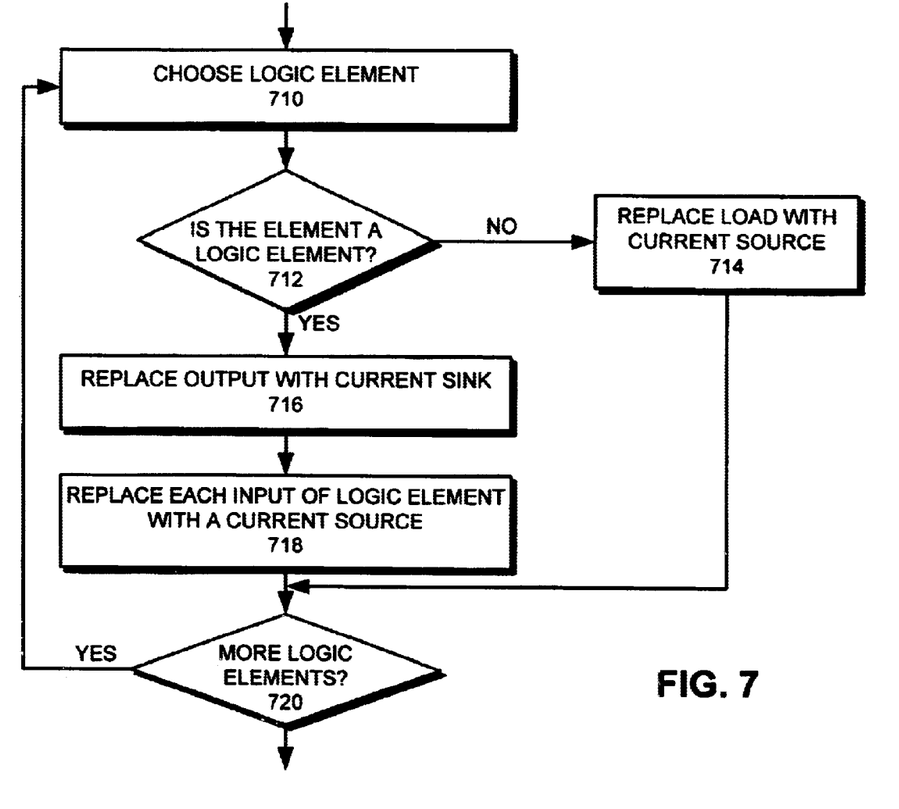
FIG. 7 is a flow chart illustrating replacing the logic elements.

A method for replacing each logic element is illustrated in FIG. 7. A circuit element is chosen (step 710). If the circuit element is not a logic element (as determined in step 712) then the method replaces the load with a current source (step 714). The current source generates a current proportional to the amount of charge needed by the load being driven. In one embodiment this current is proportional to the load's capacitance. The current may be related to the capacitance by a scaling factor determined by its capacitance relative to the output capacitance of a known logic element.

If the circuit element is a logic element (as determined in step 712), then the output of each circuit element is replaced with a current sink (step 716). In one embodiment the current sink responds by producing a voltage at its input proportional to a step-up value of the logic element. The step-up value can be the same as or different from the step-up value for any other circuit element. In another embodiment, the current sink is a resistor. In yet another embodiment the resistor is tunable.

Each input of the logic elements is then replaced by a current source (step 718). The current output by the current source for each replaced input is proportional to the charge needed to drive that input of the logic element. In one embodiment, the current is proportional to the logical effort of that input. More specifically, the current is equal the logical effort of that input multiplied by the voltage appearing at the current sink. If there are more circuit elements (step 720), the next is chosen.

After all of the logic elements are replaced, the resulting sizing model is solved for the steady state solution (step 616). As was mentioned earlier, the voltages of the steady state solution provide a size to which each logic element's transistor widths are scaled.

Figure 8:
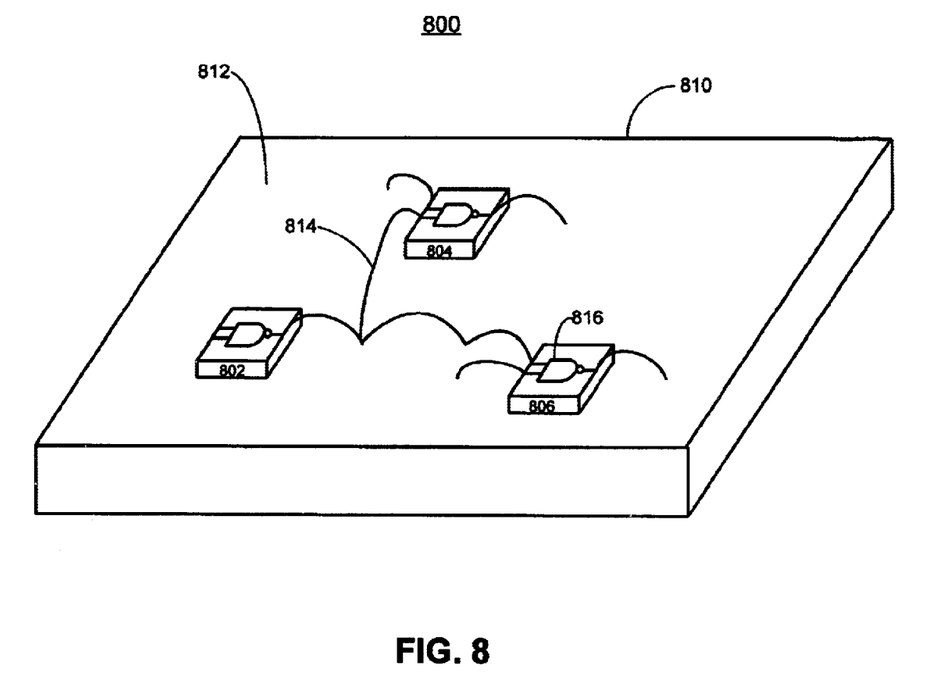
FIG. 8 is an apparatus according to the present invention.

In another embodiment, an apparatus to determine transistor sizes is provided. The apparatus includes circuit element primitives, a support, and connectors. FIG. 8 illustrates more specifically an apparatus 800 including model primitives 802, 804, and 806, support 810 including holes 812, and connectors 814. Each primitive corresponds to a logic element. For example, FIG. 8 illustrates the circuit presented in FIG. 1 with each of the logic elements 102, 104, and 106 replaced by its respective model primitive 802, 804, and 806. Model primitives 802, 804, and 806 may be placed on support 810 using holes 812. Connectors 814 connect the various model primitives together.

Each of the model primitives implements the appropriate sizing element 300 such that input to the logic elements becomes outputs of the model primitive and the output of the logic element becomes the input to the module primitive. The module primitives may contain visual aids such as drawings 816 to indicate the circuit element that was replaced.

A different circuit element primitive could exist for each type of circuit element desired. And, while the invention has been described using the NAND logic element, any type of logic element could be similarly designed using the conditions discussed.

Each input of a circuit element primitive could have a fixed logical effort value, or its logical effort could be input via various input techniques including, but not limited to a serial or parallel interface, switches, or a dial. Additionally, a step-up value (also known as the stage gain or stage effort) could also be fixed, or be input via various input techniques including, but not limited to a serial or parallel interface, switches, or a dial.

When a designer creates a sizing model he or she chooses the appropriate model primitives from the circuit description and connects the components together just like the logical circuit description. The sizing primitives, however, push current opposite to the logic flow represented by the circuit description as described above.

Once the model reaches steady state solution, the size of each logic element value can be determined from the value appearing at each model primitive. This value can be obtained by attaching a measuring device to measure the voltage at the model primitive terminal, corresponding to the logic element output, or via a built-in display that displays the value.

According to another embodiment of the invention a method of computing useful tangible logic element sizes is provided using a algorithm. In the previous embodiments, the computation may be accomplished by a variety of means including schematic capture and SPICE simulations of the sizing element. One advantage of that implementation is that it is based on the schematic capture of the circuit. A less than advantageous feature is that one may have to run SPICE twice, once to calculate the transistor sizes and then to simulate the current behavior with the calculated transistor sizes.

Figure 9:
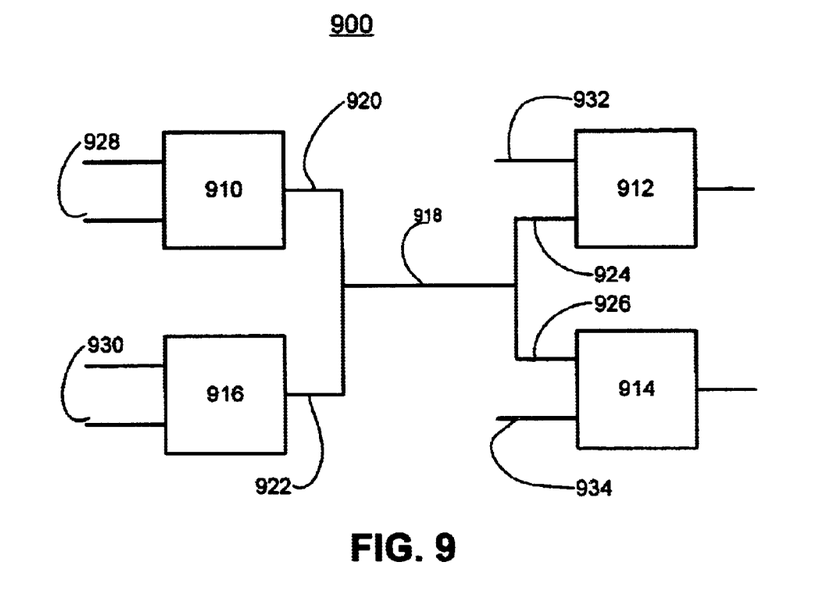
FIG. 9 illustrates a generalized model to describe the invention.

Consider the generalized circuit 900 in FIG. 9 including logic elements 910, 912, 914, and 916 and a node 918. An output 920 of logic element 910 and an output 922 of logic element 916 are connected to node 918. Node 918 is also connected to input 924 of logic element 912 and to input 926 of logic element 914. Logic element 910 may contain a number of inputs 928 and logic element 916 may contain a number of inputs 930.

Logic element 912 may also include a number of additional inputs 932 and logic element 914 may also include a number of additional inputs 934. Logic elements 912 and 914 may or may not have an output. Either the output 920 of logic element 910 or the output 922 of logic element 916 drives the node 918 to logic "1" or logic "0". At any one time at most one of outputs 920 and 922 will drive node 918 to logic "1" or logic "0". Node 918 drives the inputs 924 and 926.

The total load on node 918 is the sum of the input capacitances presented by the input 924 of logic element 912 and the input 926 of logic element 914. By using the guides presented by theory of logical effort, the load presented by input 924 of logic element 912 on node 918 is the logical effort of input 924 times the size of logic element 912. Likewise, the load presented by input 926 of logic element 914 on node 918 is the logical effort of input 926 times the size of logic element 914. The total load on node 918 is given by adding the two loads.

For logic element 910 to drive node 918 with a given step-up, the logical element 910's size is provided by dividing the total load on the node by the step-up value of logic element 910. Further, since logic element 910 must not have a width less than the minimum, the logic element 910 size is provided by taking the larger of the logic element 910 size above and the minimize gate size of logic element 910. This may be illustrated by the following equation for the general case for each gate $g_i$, $0<=i<M$, that has an output driving a node:

$$g_i.size = \max\left(\frac{(g_i.nodeload)}{(g_i.stepup)}, g_i.minsize\right) \qquad \text{Eq. 1}$$

where $$g_i.nodeload = \sum_{\text{each input } n \text{ of logic element } m} g_m.LE_n * g_m.size \qquad \text{Eq. 2}$$

The summation is taken over all gates m that have an input n driven by that node. For all other logic elements $g_i$, $M \leq i < N$ that do not have an output, their size remains fixed, and the assumption is made that $$g_i.size = g_i.minsize = g_i.maxsize \qquad \text{Eq. 3}$$

The above equations can be written in a form $x = f(x)$, where x is a vector of gate sizes, i.e., $x = (x_0, x_1, \ldots, x_N)$ and $x_i = g_i.size$ for $0 \leq i < N$ The function $f$ is given by $$f_i(x) = \max((g_i.nodeload/g_i.stepup), g_i.minsize) \text{ for } 0 \leq i < M \qquad \text{Eq. 4}$$

$$f_i(x) = g_i.minsize \text{ for } M \leq i < N \qquad \text{Eq. 5}$$

where $$g_i.nodeload = \sum_{(\text{each input } n \text{ driving gate } m)} g_m.LE_n * x_m \qquad \text{Eq. 6}$$

$$\text{for } 0 \leq i < M$$

In other words, the solutions to Eqs. 4 and 5 is a fixed point of the function $f(x)$. Furthermore, $f(x)$ is a linear function in x, that is, each function value $f_i(x)$, $0 \leq i < N$, is a linear combination of values $x_m$, $0 \leq m < N$. Finally, because the smallest sizes for the transistors within a specific range are desired, the least fixed point of $f$ within that range of values is chosen, if it exists. Notice that, in general, $f$ may have multiple fixed points.

There are several ways to solve $f(x) = x$ to obtain the least fixpoint of $f$. A first method is based on Gaussian elimination. The function $f$ is a linear function of x and so $f$ can also be viewed as a matrix multiplication, viz., $f(x) = Ax$. Solving $f(x) = x$ is the same as solving $(A-I)x = 0$, which can be done by Gaussian elimination. In general, A-I is a large sparse matrix. The running time of the algorithm depends on the running time of Gaussian elimination for large sparse matrixes.

A second method for solving $f(x) = x$ is also provided. Approximating the least fixed point for $f$ within a specific range is simple, because $f$ is a monotonic function on a complete lattice. The complete lattice is given by $(V, \leq=)$, where $V = V_0 \times V_1 \times \ldots \times V_N$ and $V_i = \{x | g_i.minsize \leq x\}$. The ordering $\leq=$ on V is taken element-wise. The monotonicity off follows from the property that if $x \leq y$, then we also have $f(x) \leq f(y)$, where $\leq=$ is taken element-wise. From lattice theory, one can now conclude that the sequence $f^k(x0)$ with $x0_i = g_i.minsize$ for $0 \leq i < N$, is an ascending sequence for $k = 0, 1, 2, \ldots$, and this sequence converges to the least fixpoint of $f$.

This property from lattice theory immediately suggests a method for computing the transistor sizes within the given ranges. The method terminates as soon as convergence has been detected or when a size gets out of bounds. The method converges successfully when the difference between successive approximations is smaller than $\epsilon$ for all vector elements. The following provides a pseudo code fragment to calculate the sizes.

```
for i=0 to N do x_i:= g_i.minsize;
error:= "inf";
while error > epsilon do
   oldx:=x;
   "x:= f(x)";
   error:= 0;
   for i=0 to M do
      if x_i>g_i.maxsize then return("size out of bounds")
              else error := max(x_i - oldx_i, error)
   od
od
return("found transistor sizes")
```

Notice that for implementing "$x := f(x)$" the algorithm must compute all loads of the nodes first and subsequently assign the values for $f_i(x)$ to $x_i$, $0 \leq i < M$ The method runs quickly, because $f(x)$ is a linear function in x, and the convergence of the method is also linear. That is, the difference between successive approximations will decrease by a constant factor. In case of divergence this difference will increase by a constant factor. Because the range for the transistor sizes is small, like from about 0.6 to about 15 microns, and the accuracy for the optimal transistor sizes does not need to be high, for most practical cases the algorithm will terminate within a few iterations. Notice also that in each iteration, only a few statements need to be executed. For these reasons, this method may be faster than Gaussian elimination. Furthermore, it is simpler.

The method may be implemented in a computer aided design (CAD) tool. Each circuit primitive must have the necessary parameters, and all parameters must have a value, except the parameter size. Furthermore, the topology of the circuit must be known. In particular, the method must be able to extract for each logic element what other elements it drives. After executing the method, a value can be assigned to size for each logic element.

A computing device may include a processor with an associated memory which may contain instructions for performing one or more steps of the invention. Persistent storage of these instructions may be in a server system remote from the network and the processor. Furthermore, instructions may be stored on a computer readable storage medium, which may be any device or medium that can store code and/or data for use by a computer system. This includes, but is not limited to, magnetic and optical storage devices such as disc drives, magnetic tape, CDs (compact disks) and DVDs (digital video discs), and computer instruction signals embodied in a transmission medium (with or without a carrier wave upon which the signals are modulated).

Figure 10:
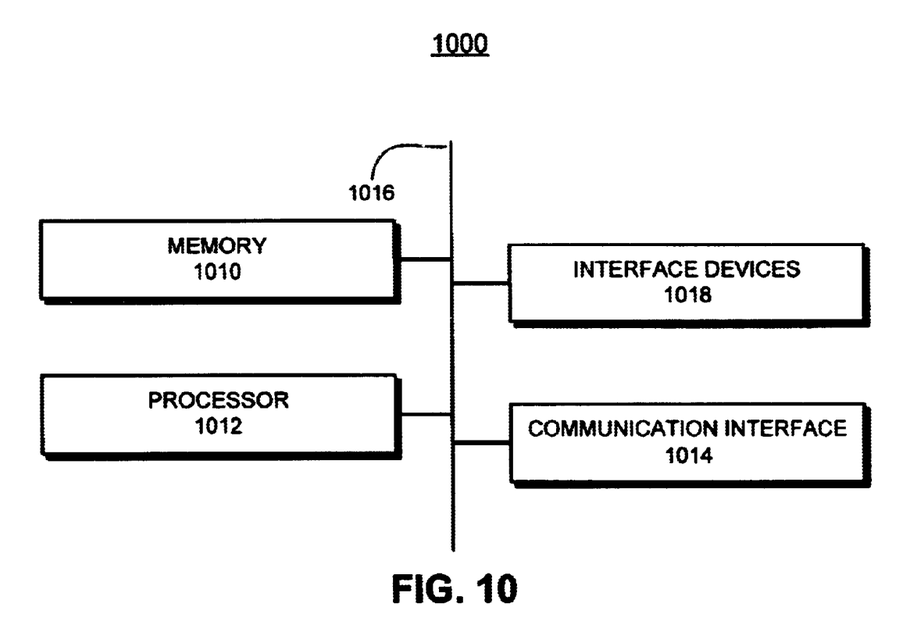
FIG. 10 illustrates an apparatus for implementing the invention.

FIG. 10 illustrates one such system 1000 for implementing the invention. System 1000 includes a memory 1010, a processor 1012, a bus 1016, a communication interface 1014, and interface devices 1018. Processor 1012 may include any type of computational engine for executing programs within system 1000. This includes, but is not limited to, a microprocessor, a device controller, and a computation device within an appliance. Memory 1010 may include any type of random access memory for storing code and data for use by processor 1012. System 1000 may also include secondary storage device 1022 (not shown) which may include any type of non-volatile storage device for storing code and data for use by processor 1012 like magnetic storage device, such as disk drives. and electronic storage devices such as a flash memory or battery backed up random access memory.

Communication interface 1014 may include any type of mechanism for communication between computer system 1000 and any other device. This may include any type of communication medium including, but not limited to, electrical, optical, Infrared or radio signal communication pathway.

Interface devices 1018 are any types of devices used to allow a user to interact with system 1000. This may include, for example, displays, keyboards, computer mice, touch sensitive displays, audio devices, or any other device that allows users to interact with system 1000.

While the preferred embodiments of the present invention have been illustrated herein in detail, it should be apparent that modifications and adaptations to those embodiments may occur to those skilled in the art without departing from the scope of the present invention as set forth in the following claims.

What is claimed is:

1. A method of determining transistor sizes comprising:
   creating a circuit description including logic elements;
   replacing each logic element with an associated sizing element to create a sizing model, wherein the sizing element is related to a step-up value and a logical effort value;
   determining a steady state solution to the sizing model, wherein the steady state solution is indicated by a stable set of voltages and currents in the sizing model; and
   determining transistor sizes from the steady state solution.

2. The method of claim 1, wherein the sizing element are calculated by any one of analog circuit simulation methods, Gaussian elimination methods, and approximation methods.

3. The method of claim 1, wherein the replacing each logic element with an associated sizing element comprises replacing a logic element input with a sizing device output that generates a first current.

4. The method of claim 3, wherein the first current is proportional to a size of the logic element input being modeled.

5. The method of claim 4, wherein the first current is proportional to current values appearing at a sizing element input when all logic elements are replaced.

6. The method of claim 3, further includes replacing an output of the logic element with a sizing element input.

7. The method of claim 6, wherein the sizing element input is provided as a resistor.

8. The method of claim 7, wherein the resistor is provided as a tunable resistor.

9. The method of claim 6, wherein the sizing element provides the first current proportional to a second current appearing at the sizing element input.

10. The method of claim 1, wherein the replacing each logic element comprises replacing an input of the logic element with a first device that outputs a first current proportional to a logical effort of the input of the logic element.

11. The method of claim 2, wherein the replacing an input of the logic element comprises replacing the input of the logic element with a sizing element output producing a current proportional to a required charge of the input of the logic element.

12. The method of claim 11, further providing the required charge as being proportional to a size of a capacitance of the input to the logic element.

13. The method of claim 3, wherein the replacing each logic element further includes replacing an output of the logic element with a second device that sinks a second current.

14. The method of claim 13, wherein the replacing the output of the logic element includes replacing the output of the logic element with a resistor.

15. The method of claim 14, further including providing the resistor as having a resistance equal to an inverse of the step-up value.

16. The method of claim 15, further including determining transistor sizes by measuring a voltage across the resistor.

17. The method of claim 15, further including displaying a voltage across the resistor.

18. A device for determining transistor sizes of a logic element having an element input and an element output comprising:
   a current output module corresponding to the element input that outputs a first current;
   a current input module corresponding to the element output that receives at least one second current and connected to the current output module; and
   a transistor size output connected to the current input module.

19. The device of claim 18, wherein
   the current input module comprises a sizing device connected between the corresponding logic element output and ground; and
   the current output module is adapted to relate the first current to a sizing voltage across the sizing device.

20. The device of claim 19, wherein the sizing device is a resistor.

21. The device of claim 20, wherein the resistor is tunable.

22. The device of claim 21, wherein the current output module includes a current generating device adapted to generate a current equal to a value multiplied by the sizing voltage.

23. The device of claim 22, further comprising a logical effort input module that receives the value.

24. A system for determining transistor sizes comprising:
   a plurality of module primitives, each module primitive corresponding to a particular logic element, wherein the particular logic element has a logic element input, and wherein each module primitive has a module output corresponding to the logic element input:
      a support adapted to receive module primitives adapted to receive the circuit primitives reflecting a particular circuit configuration and to achieve a steady state when powered, wherein the steady state is indicated by a stable set of voltages and currents; and
      connectors for connecting module primitives on the support.

25. The system of claim 24, wherein each module primitive has a current source connected to the module primitive output, the output of the current source being proportional to a logical effort of the logic element input.

26. The system of claim 25, wherein the particular logic element further includes a logic element output and each module primitive further comprises:
   a module input corresponding to the logic element output; and
   a resistor connected between the module input and ground.

27. The system of claim 26, wherein the resistor is tunable.

28. The system of claim 25, wherein the circuit module further includes a logical effort input adapted to receive a value of the logical effort, and
   the particular logic element further includes a logic element output and each module primitive further comprises:

a module input corresponding to the logic element output; and a tunable resistor connected between the module input and ground.

29. The system of 27, wherein each module primitive includes an indicator adapted to indicate a voltage across the resistor or tunable resistor.

30. The system of 28, wherein each module primitive is adapted to receive a logical effort for each input.

31. A method of computing logic element sizes comprising:

computing for each driving logic element, a respective driven load incurred by each driving logic element;

providing each driving logic element a respective step-up value; and dividing the respective driven loads by the respective step-up value to determine the respective logic element size.

32. The method of claim 31, wherein computing the respective driven load comprises:

calculating, for each driven logic element that the respective driving logic element drives, a respective logic element load; and summing, for each logic element, the respective logic element loads to determine the respective driven load.

33. The method of claim 32, wherein calculating the respective logic element load comprises multiplying a driven logic element's size by a logical effort of the driven input of the logic element.

34. The method of claim 33, further comprising selecting the larger of a minimum logic element size and the result of the dividing step for each driving logic element.

35. A method of calculating logic element sizes comprising:

determining a nodeload $g_i.nodeload$ for each gate i;

dividing each $g_i.nodeload$ by a step-up value for gate i to determine a logic element size for gate i.

36. The method of claim 35, wherein determining each nodeload $g_i nodeload$ comprises:

$$g_i.nodeload = \sum_{\text{each input } n \text{ of logic element } m} g_m.LE_n * g_m.size$$

where n is taken over each gate that the gate i drives; $g_m.LE_n$ is the logical effort of input n gate m; and $g_m.size$ is a logic element size of the driven gate.

* * * * *